US005729410A

United States Patent [19]

Fontana, Jr. et al.

[11] Patent Number: 5,729,410
[45] Date of Patent: Mar. 17, 1998

[54] MAGNETIC TUNNEL JUNCTION DEVICE WITH LONGITUDINAL BIASING

[75] Inventors: Robert Edward Fontana, Jr.; Stuart Stephen Papworth Parkin, both of San Jose, Calif.

[73] Assignee: International Business Machines Corporation, Armonk, N.Y.

[21] Appl. No.: 757,422

[22] Filed: Nov. 27, 1996

[51] Int. Cl.⁶ .................... G11B 5/39; G11C 11/00; H01L 41/12
[52] U.S. Cl. .................... 360/113; 257/421; 365/158
[58] Field of Search .................... 360/113; 257/421–427; 365/158, 171, 173

[56] References Cited

U.S. PATENT DOCUMENTS

| | | | |
|---|---|---|---|
| 3,623,038 | 11/1971 | Franklin et al. | 340/174 TF |
| 5,018,037 | 5/1991 | Krounbi et al. | 360/113 |
| 5,390,061 | 2/1995 | Nakatani et al. | 360/113 |
| 5,416,353 | 5/1995 | Kamiguchi et al. | 257/421 |
| 5,432,734 | 7/1995 | Kawano et al. | 365/158 |
| 5,465,185 | 11/1995 | Heim et al. | 360/113 |
| 5,528,440 | 6/1996 | Fontana et al. | 360/113 |
| 5,629,922 | 5/1997 | Moordera | 360/113 |

FOREIGN PATENT DOCUMENTS

WO 95/10123  4/1995  WIPO ................ H01L 43/08

OTHER PUBLICATIONS

M. Julliere, "Tunneling Between Ferromagnetic Films", Physics Letters, vol. 54A, No. 3, Sep. 8, 1975, pp. 225–226.
K. Matsuyama et al., "Fabrication of Microstructured Magnetic Tunneling Valve Junction", IEEE Transactions on Magnetics, vol. 31, No. 6, Nov. 1995, pp. 3176–3178.
J.S. Moodera et al., "Ferromagnetic–insulator–ferromagnetic Tunneling: Spin–dependent Tunneling and Large Magnetoresistance in Trilayer Junctions", Symposium on Spin Tunneling and Injection Phenomena, Journal of Applied Physics, vol. 79, No. 8, Apr. 15, 1996, pp. 4724–4729.

Primary Examiner—A. J. Heinz
Attorney, Agent, or Firm—Thomas R. Berthold

[57] ABSTRACT

A magnetic tunnel junction device for use as a magnetic memory cell or a magnetic field sensor has one fixed ferromagnetic layer and one sensing ferromagnetic layer formed on opposite sides of the insulating tunnel barrier layer, and a hard biasing ferromagnetic layer that is electrically insulated from but yet magnetostatically coupled with the sensing ferromagnetic layer. The magnetic tunnel junction in the device is formed on an electrical lead on a substrate and is made up of a stack of layers. The layers in the stack are an antiferromagnetic layer, a fixed ferromagnetic layer exchange biased with the antiferromagnetic layer so that its magnetic moment cannot rotate in the presence of an applied magnetic field, an insulating tunnel barrier layer in contact with the fixed ferromagnetic layer, and a sensing ferromagnetic layer in contact with the tunnel barrier layer and whose magnetic moment is free to rotate in the presence of an applied magnetic field. The stack is generally rectangularly shaped with parallel side edges. A layer of hard biasing ferromagnetic material is located near to but spaced from the side edges of the sensing ferromagnetic layer to longitudinally bias the magnetic moment of the sensing ferromagnetic layer in a preferred direction. A layer of electrically insulating material isolates the hard biasing material from the electrical lead and the sensing ferromagnetic layer so that sense current is not shunted to the hard biasing material but is allowed to flow perpendicularly through the layers in the stack.

14 Claims, 7 Drawing Sheets

MAGNETIC TUNNEL JUNCTION DEVICE WITH LONGITUDINAL BIASING

TECHNICAL FIELD

This invention relates in general to a magnetic tunnel junction (MTJ) device, and more particularly to an MTJ device for use as a magnetoresistive (MR) head for reading magnetically-recorded data.

BACKGROUND OF THE INVENTION

A magnetic tunnel junction (MTJ) device is comprised of two ferromagnetic layers separated by a thin insulating tunnel barrier layer and is based on the phenomenon of spin-polarized electron tunneling. One of the ferromagnetic layers has a higher saturation field in one direction of an applied magnetic field, typically due to its higher coercivity than the other ferromagnetic layer. The insulating tunnel barrier layer is thin enough that quantum mechanical tunneling occurs between the ferromagnetic layers. The tunneling phenomenon is electron-spin dependent, making the magnetic response of the MTJ a function of the relative orientations and spin polarizations of the two ferromagnetic layers.

MTJ devices have been proposed primarily as memory cells for solid state memory. The state of the MTJ memory cell is determined by measuring the resistance of the MTJ when a sense current is passed perpendicularly through the MTJ from one ferromagnetic layer to the other. The probability of tunneling of charge carriers across the insulating tunnel barrier layer depends on the relative alignment of the magnetic moments (magnetization directions) of the two ferromagnetic layers. The tunneling current is spin polarized, which means that the electrical current passing from one of the ferromagnetic layers, for example, a layer whose magnetic moment is fixed or prevented from rotation, is predominantly composed of electrons of one spin type (spin up or spin down, depending on the orientation of the magnetic moment of the ferromagnetic layer). The degree of spin polarization of the tunneling current is determined by the electronic band structure of the magnetic material comprising the ferromagnetic layer at the interface of the ferromagnetic layer with the tunnel barrier layer. The first ferromagnetic layer thus acts as a spin filter. The probability of tunneling of the charge carriers depends on the availability of electronic states of the same spin polarization as the spin polarization of the electrical current in the second ferromagnetic layer. Usually, when the magnetic moment of the second ferromagnetic layer is parallel to the magnetic moment of the first ferromagnetic layer, there are more available electronic states than when the magnetic moment of the second ferromagnetic layer is aligned antiparallel to that of the first ferromagnetic layer. Thus, the tunneling probability of the charge carriers is highest when the magnetic moments of both layers are parallel, and is lowest when the magnetic moments are antiparallel. When the moments are arranged neither parallel nor antiparallel, the tunneling probability takes an intermediate value. Thus, the electrical resistance of the MTJ memory cell depends on both the spin polarization of the electrical current and the electronic states in both of the ferromagnetic layers. As a result, the two possible magnetization directions of the ferromagnetic layer whose magnetization direction is not fixed uniquely define two possible bit states (0 or 1) of the memory cell. Although the possibility of MTJ memory cells has been known for some time, serious interest has lagged because of difficulties in achieving responses of the magnitude predicted in practical structures and at noncryogenic temperatures.

A magnetoresistive (MR) sensor detects magnetic field signals through the resistance changes of a read element, fabricated of a magnetic material, as a function of the strength and direction of magnetic flux being sensed by the read element. The conventional MR sensor, such as that used as a MR read head for reading data in magnetic recording disk drives, operates on the basis of the anisotropic magnetoresistive (AMR) effect of the bulk magnetic material, which is typically permalloy ($Ni_{81}Fe_{19}$). A component of the read element resistance varies as the square of the cosine of the angle between the magnetization direction in the read element and the direction of sense current through the read element. Recorded data can be read from a magnetic medium, such as the disk in a disk drive, because the external magnetic field from the recorded magnetic medium (the signal field) causes a change in the direction of magnetization in the read element, which in turn causes a change in resistance of the read element and a corresponding change in the sensed current or voltage.

The use of an MTJ device as a MR read head has also been proposed, as described in U.S. Pat. No. 5,390,061. One of the problems with such a MR read head, however, lies in developing a structure that generates an output signal that is both stable and linear with the magnetic field strength from the recorded medium. If some means is not used to maintain the ferromagnetic sensing layer of the MTJ device (i.e., the ferromagnetic layer whose moment is not fixed) in a single magnetic domain state, the domain walls of magnetic domains will shift positions within the ferromagnetic sensing layer, causing noise which reduces the signal-to-noise ratio and which may give rise to an irreproducible response of the head. A linear response of the head is required. The problem of maintaining a single magnetic domain state is especially difficult in the case of an MTJ MR read head because, unlike an AMR sensor, the sense current passes perpendicularly through the ferromagnetic layers and the tunnel barrier layer, and thus any metallic materials in direct contact with the edges of the ferromagnetic layers will short circuit the electrical resistance of the read head.

What is needed is an MTJ device that has a stable and linear output and can thus function as an MTJ MR read head which provides a linear response to the magnetic fields from the recorded medium.

SUMMARY OF THE INVENTION

The invention is an MTJ device with one fixed ferromagnetic layer and one sensing ferromagnetic layer on opposite sides of the tunnel barrier layer, and with a hard biasing ferromagnetic layer that is electrically insulated from but yet magnetostatically coupled with the sensing ferromagnetic layer. The magnetic tunnel junction in the MTJ device is formed on an electrical lead on a substrate and is made up of a stack of layers. The layers in the stack are an antiferromagnetic layer, a fixed ferromagnetic layer exchange biased with the antiferromagnetic layer so that its magnetic moment cannot rotate in the presence of an applied magnetic field, an insulating tunnel barrier layer in contact with the fixed ferromagnetic layer, and a sensing ferromagnetic layer in contact with the tunnel barrier layer and whose magnetic moment is free to rotate in the presence of an applied magnetic field. The stack is generally rectangularly shaped with parallel side edges so that the layers have contiguous edges. A layer of hard biasing ferromagnetic material is located near to but spaced from the side edges of the sensing ferromagnetic layer to longitudinally bias the magnetic moment of the sensing ferromagnetic layer in a preferred direction in the absence of an applied magnetic field. A layer of electrically insulating material isolates the hard biasing material from the electrical lead and the sensing ferromagnetic layer so that sense current is not shunted to the hard biasing material but is allowed to flow perpendicularly through the layers in the magnetic tunnel junction stack.

For a fuller understanding of the nature and advantages of the present invention, reference should be made to the following detailed description taken together with the accompanying figures.

DETAILED DESCRIPTION OF THE INVENTION

Prior Art

Although the MTJ device of the present invention will be described below as embodied as a MR sensor in a magnetic recording disk drive, the invention is also applicable to other MTJ applications, such as memory cells, and other magnetic recording systems, such as magnetic tape recording systems.

Figure 1:
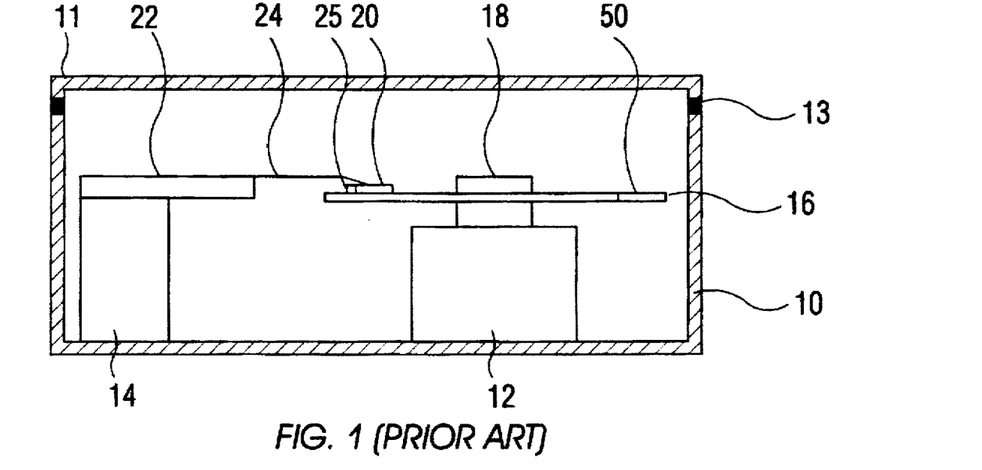
FIG. 1 is a simplified block diagram of a conventional magnetic recording disk drive for use with the MTJ MR read head according to the present invention.

Referring first to FIG. 1, there is illustrated in sectional view a schematic of a prior art disk drive of the type using a MR sensor. The disk drive comprises a base 10 to which are secured a disk drive motor 12 and an actuator 14, and a cover 11. The base 10 and cover 11 provide a substantially sealed housing for the disk drive. Typically, there is a gasket 13 located between base 10 and cover 11 and a small breather port (not shown) for equalizing pressure between the interior of the disk drive and the outside environment. A magnetic recording disk 16 is connected to drive motor 12 by means of hub 18 to which it is attached for rotation by the drive motor 12. A thin lubricant film 50 is maintained on the surface of disk 16. A read/write head or transducer 25 is formed on the trailing end of a carrier, such as an air-bearing slider 20. Transducer 25 is a read/write head comprising an inductive write head portion and a MR read head portion, as will be described with respect to FIG. 3. The slider 20 is connected to the actuator 14 by means of a rigid arm 22 and a suspension 24. The suspension 24 provides a biasing force which urges the slider 20 onto the surface of the recording disk 16. During operation of the disk drive, the drive motor 12 rotates the disk 16 at a constant speed, and the actuator 14, which is typically a linear or rotary voice coil motor (VCM), moves the slider 20 generally radially across the surface of the disk 16 so that the read/write head 25 may access different data tracks on disk 16.

Figure 2:
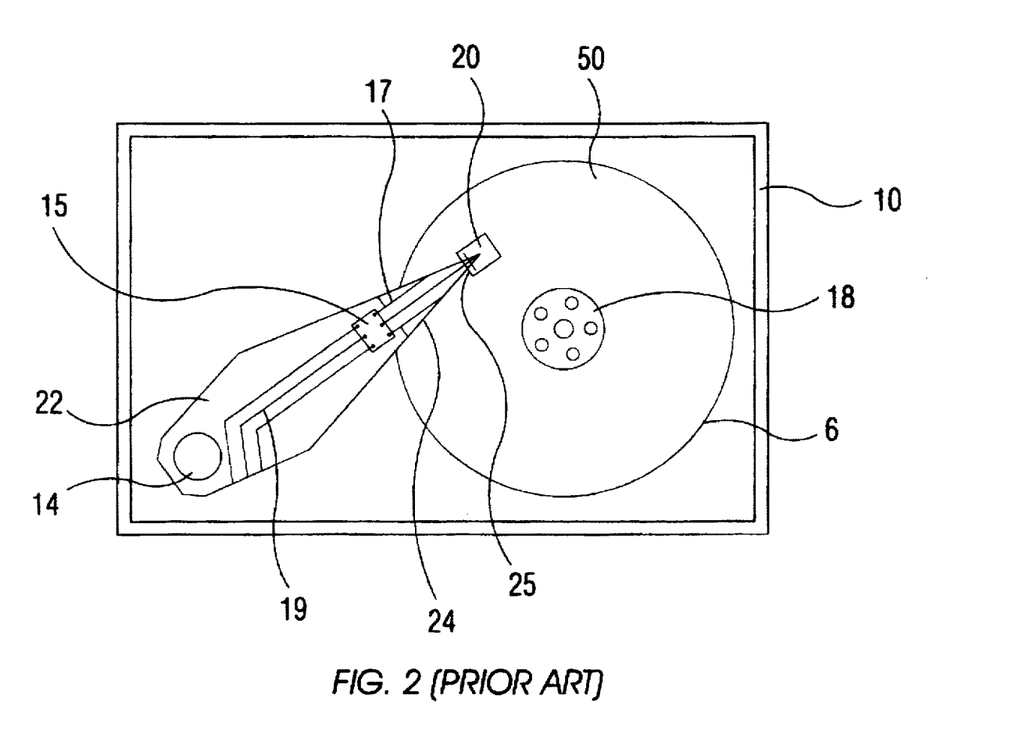
FIG. 2 is a top view of the disk drive of FIG. 1 with the cover removed.

FIG. 2 is a top view of the interior of the disk drive with the cover 11 removed, and illustrates in better detail the suspension 24 which provides a force to the slider 20 to urge it toward the disk 16. The suspension may be a conventional type of suspension, such as the well-known Watrous suspension, as described in IBM's U.S. Pat. No. 4,167,765. This type of suspension also provides a gimbaled attachment of the slider which allows the slider to pitch and roll as it rides on the air bearing. The data detected from disk 16 by the transducer 25 is processed into a data readback signal by signal amplification and processing circuitry in the integrated circuit chip 15 located on arm 22. The signals from transducer 25 travel via flex cable 17 to chip 15, which sends its output signals to the disk drive electronics (not shown) via cable 19.

Figure 3:
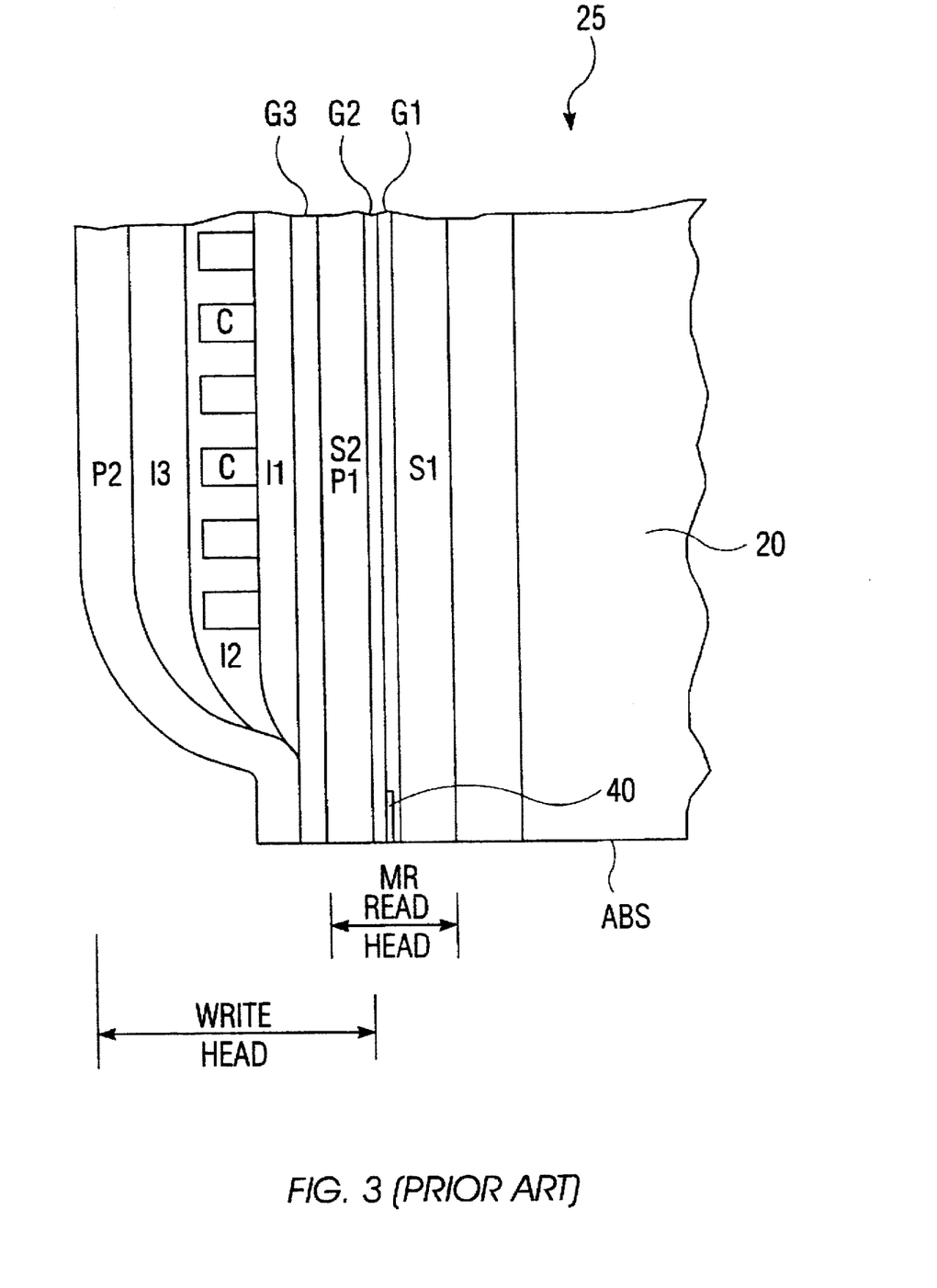
FIG. 3 is a vertical cross-section of a conventional inductive write head/MR read head with the MR read head located between shields and adjacent to the inductive write head.

FIG. 3 is a cross-sectional schematic view of the read/write head 25 which includes a MR read head portion and an inductive write head portion. The head 25 is lapped to form an air-bearing surface (ABS), the ABS being spaced from the surface of the rotating disk 16 (FIG. 1) by the air bearing as discussed above. The read head includes a MR sensor 40 sandwiched between first and second gap layers G1 and G2 which are, in turn, sandwiched between first and second shield layers S1 and S2. In a conventional disk drive, the MR sensor 40 is an AMR sensor. The write head includes a coil layer C and insulation layer I2 which are sandwiched between insulation layers I1 and I3 which are, in turn, sandwiched between first and second pole pieces P1 and P2. A gap layer G3 is sandwiched between the first and second pole pieces P1, P2 at their pole tips adjacent to the ABS for providing a magnetic gap. During writing, signal current is conducted through the coil layer C and flux is induced into the first and second pole layers P1, P2 causing flux to fringe across the pole tips at the ABS. This flux magnetizes circular tracks on the rotating disk 16 during a write operation. During a read operation, magnetized regions on the rotating disk 16 inject flux into the MR sensor 40 of the read head, causing resistance changes in the MR sensor 40. These resistance changes are detected by detecting voltage changes across the MR sensor 40. The voltage changes are processed by the chip 15 (FIG. 2) and drive electronics and converted into user data. The combined head 25 shown in FIG. 3 is a "merged" head in which the second shield layer S2 of the read head is employed as a first pole piece P1 for the write head. In a piggyback head (not shown), the second shield layer S2 and the first pole piece P1 are separate layers.

The above description of a typical magnetic recording disk drive with an AMR read head, and the accompanying FIGS. 1–3, are for representation purposes only. Disk drives may contain a large number of disks and actuators, and each actuator may support a number of sliders. In addition, instead of an air-bearing slider, the head carrier may be one which maintains the head in contact or near contact with the disk, such as in liquid bearing and other contact and near-contact recording disk drives.

Preferred Embodiments

The present invention is a MR read head with an MTJ sensor for use in place of the MR sensor 40 in the read/write head 25 of FIG. 3.

Figure 4A:
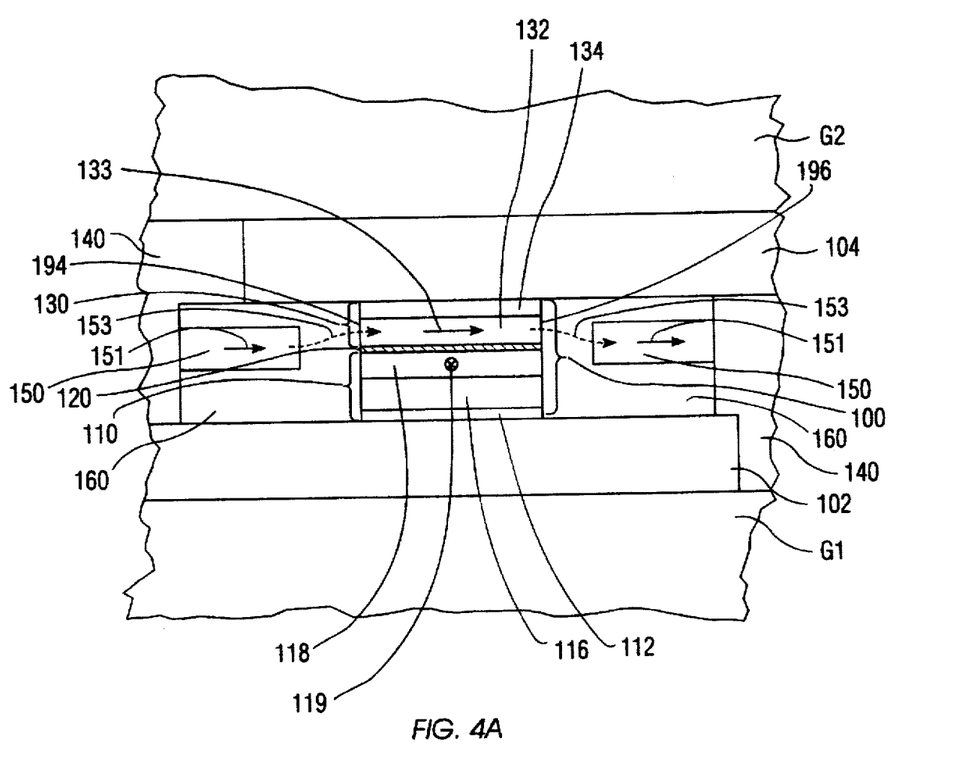
FIGS. 4A–4B show a cross-section view and a top view, respectively, of an MTJ MR read head of the present invention.

Referring first to FIG. 4A, the MTJ MR read head includes a bottom electrical lead 102 formed on the gap layer G1 substrate, a top electrical lead 104 below gap layer G2, and the MTJ 100 formed as a stack of layers between top and bottom electrical leads 102, 104.

The MTJ 100 includes a first electrode multilayer stack 110, an insulating tunnel barrier layer 120, and a top electrode stack 130. Each of the electrodes includes a ferromagnetic layer in direct contact with tunnel barrier layer 120, i.e., ferromagnetic layers 118 and 132.

The base electrode layer stack 110 formed on electrical lead 102 includes a seed or "template" layer 112 on the lead 102, a layer of antiferromagnetic material 116 on the template layer 112, and a "fixed" ferromagnetic layer 118 formed on and exchange coupled with the underlying antiferromagnetic layer 116. The ferromagnetic layer 118 is called the fixed layer because its magnetic moment or magnetization direction is prevented from rotation in the presence of applied magnetic fields in the desired range of interest. The top electrode stack 130 includes a "sensing" ferromagnetic layer 132 and a protective or capping layer 134 formed on the sensing layer 132. The sensing ferromagnetic layer 132 is not exchange coupled to an antiferromagnetic layer, and its magnetization direction is thus free to rotate in the presence of applied magnetic fields in the range of interest. The sensing ferromagnetic layer 132 is fabricated so as to have its magnetic moment or magnetization direction (shown by arrow 133) oriented generally parallel to the ABS (FIG. 3) and generally perpendicular to the magnetization direction of the fixed ferromagnetic layer 118 in the absence of an applied magnetic field. The fixed ferromagnetic layer 118 in electrode stack 110 just beneath the tunnel barrier layer 120 has its magnetization direction fixed by interfacial exchange coupling with the immediately underlying antiferromagnetic layer 116, which also forms part of bottom electrode stack 110. The magnetization direction of the fixed ferromagnetic layer 118 is oriented generally perpendicular to the ABS, i.e., out of or into the paper in FIG. 4A (as shown by arrow tail 119).

Also shown in FIG. 4A is a biasing ferromagnetic layer 150 for longitudinally biasing the magnetization of the sensing ferromagnetic layer 132, and an insulating layer 160 separating and isolating the biasing layer 150 from the sensing ferromagnetic layer 132 and the other layers of the MTJ 100. The biasing ferromagnetic layer 150 is a hard magnetic material, such as a CoPtCr alloy, that has its magnetic moment (shown by arrow 151) aligned in the same direction as the magnetic moment 133 of the sensing ferromagnetic layer 132 in the absence of an applied magnetic field. The insulating layer 160, which is preferably alumina ($Al_2O_3$) or silica ($SiO_2$), has a thickness sufficient to electrically isolate the biasing layer 150 from the MTJ 100 and the electrical leads 102, 104, but is still thin enough to permit magnetostatic coupling (shown by dashed arrow 153) with the sensing ferromagnetic layer 132. The product M*t (where M is the magnetic moment per unit area of the material in the ferromagnetic layer and t is the thickness of the ferromagnetic layer) of the biasing ferromagnetic layer 150 must be greater than or equal to the M*t of the sensing ferromagnetic layer 132 to assure stable longitudinal biasing. Since the magnetic moment of $Ni_{(100-x)}$—$Fe_{(x)}$ (x being approximately 19) that is used in the sensing ferromagnetic layer 132 is about twice that of the magnetic moment of a typical hard magnetic material suitable for the biasing ferromagnetic layer 150, such as $Co_{75}Pt_{13}Cr_{12}$, the thickness of the biasing ferromagnetic layer 150 should be at least approximately twice that of the sensing ferromagnetic layer 132.

Figure 4B:
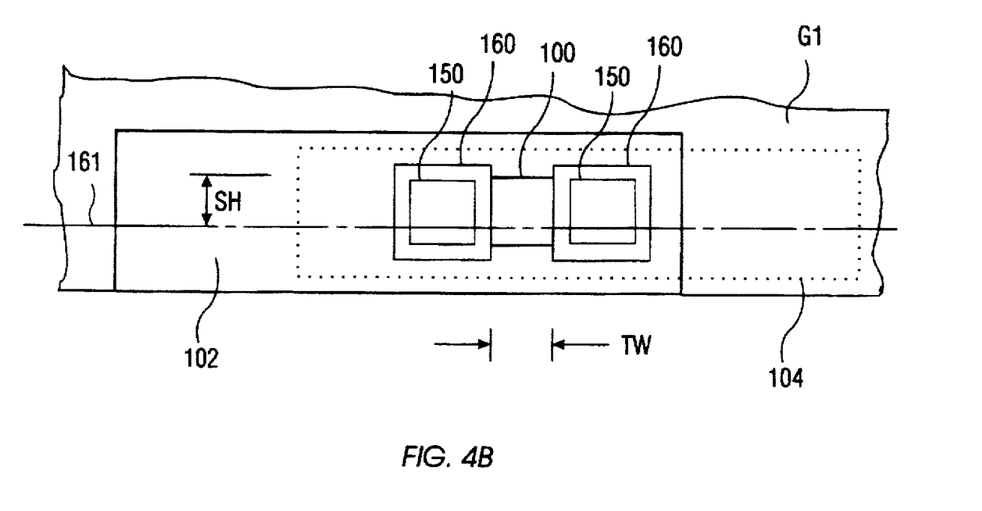

FIG. 4B is a top view of the MTJ MR head of FIG. 4A with the layers above and including the G2 layer removed and the top electrical lead 104 shown in dotted lines so that the underlying head can be illustrated. The dashed line 161 represents the ABS and the line to which the layers are lapped back after the MTJ MR head is fabricated. The MTJ 100 is depicted as a stripe having a width TW, appropriate to the track width of the recorded data on the disk, and a final stripe height SH after lapping. The width of the recorded data track is wider than TW.

Figure 5:
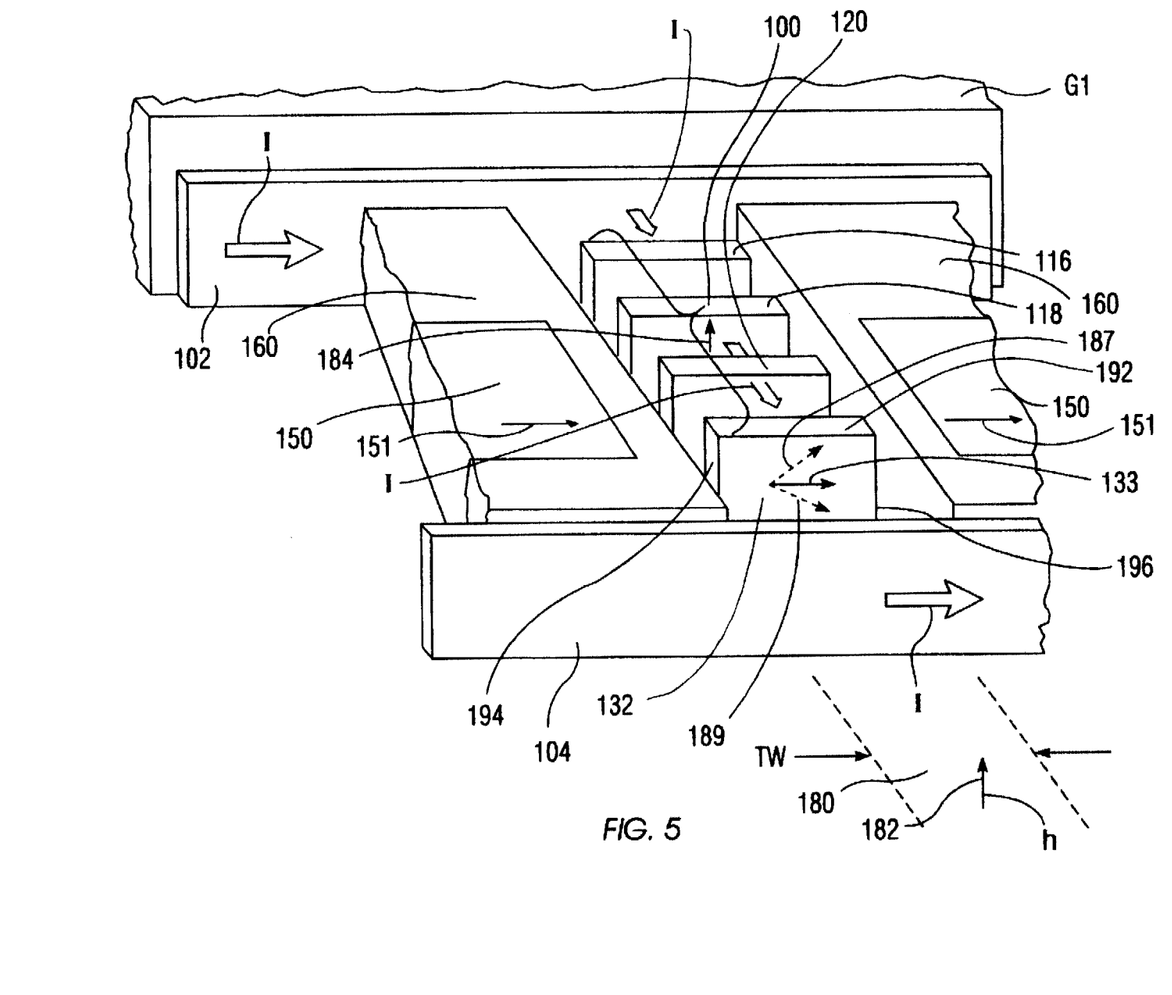
FIG. 5 is a perspective view of the MTJ MR read head of FIGS. 4A–4B for illustrating the arrangement of the various layers of material, including the structure for providing longitudinal biasing of the sensing ferromagnetic layer.

FIG. 5 is a schematic perspective view of the MTJ MR read head of FIGS. 4A–4B shown adjacent to a magnetic recording medium, such as the disk of a disk drive, and depicts the important layers of the MTJ 100 separated for ease in illustrating the operation of the read head. A data track 180 having a track width TW on the disk is shown with recorded data that generates a magnetic field h in the direction indicated by arrow 182. The fixed ferromagnetic layer 118 has its magnetic moment, indicated by arrow 184, oriented perpendicular to the ABS and generally parallel or antiparallel to the magnetic field direction h from the disk. The direction 184 is fixed, even in the presence of applied magnetic field h from recorded data, due to interfacial exchange coupling from adjacent antiferromagnetic layer 116. The sensing ferromagnetic layer 132 has a generally rectangular shape with a sensing edge (not shown) at the ABS, a back edge 192, and two parallel side edges 194, 196. As shown, the other layers of MTJ 100 have edges generally contiguous with the edges of layer 132. The ferromagnetic sensing layer 132 has its magnetic moment aligned in the direction parallel to the ABS and the disk surface, as indicated by arrow 133, in the absence of an applied magnetic field. The biasing ferromagnetic layer 150 has its magnetic moment, indicated by arrow 151, aligned generally parallel with direction 133 to provide the sensing ferromagnetic layer 132 with a generally single magnetic domain state. Magnetostatic coupling occurs across the insulating layer 160 that electrically isolates the hard magnetic material of biasing layer 150 from the MTJ 100.

A sense current I is directed from first electrical lead 102 perpendicularly through the antiferromagnetic layer 116, the fixed ferromagnetic layer 118, the tunnel barrier layer 120, and the sensing ferromagnetic layer 132 and then out through the second electrical lead 104. As described previously, the amount of tunneling current through the tunnel barrier layer 120 is a function of the relative orientations of the magnetizations of the fixed and sensing ferromagnetic layers 118, 132 that are adjacent to and in contact with the tunnel barrier layer 120. The magnetic field h from the recorded data causes the magnetization direction of sensing ferromagnetic layer 132 to rotate away from the direction 133, as shown by the dashed arrows 187, 189. This changes the relative orientation of the magnetic moments of the ferromagnetic layers 118, 132 and thus the amount of tunneling current, which is reflected as a change in electrical resistance of the MTJ 100. This change in resistance is detected by the disk drive electronics and processed into data read back from the disk. The sense current is prevented from reaching the biasing ferromagnetic layer 150 by the electrical insulating layer 160, which also insulates the biasing ferromagnetic layer 150 from the electrical leads 102, 104. While in the preferred embodiment the biasing ferromagnetic layer 150 is electrically insulated from both leads 102, 104, it could be formed in contact with one of the leads so long as it is insulated from the other lead and the tunnel barrier layer 120. The insulating layer 160 thus assures that there is no shunting of sense current and thus no adverse affect on the resistance of the MTJ MR head, while at the same time permitting magnetostatic coupling into the sensing ferromagnetic layer 132 by the biasing ferromagnetic layer 150.

The insulating layer 160 and the ferromagnetic layer 150 are formed using three distinct depositions. First, a first alumina deposition forms the bottom portion of layer 160 and also conforms onto the side edges 194 and 196 of the sensing ferromagnetic layer 132 (FIG. 4A). If an RF sputter deposition technique is used for the insulating layer deposition, the thickness of the insulating layer on the side wall is less than on a flat surface. Typical sputter efficiencies on side walls are ½ to ¾ that of the sputter efficiencies on flat surfaces. Second, the hard biasing ferromagnetic layer 150 is deposited using a directional deposition technique, such as ion beam deposition. The alumina from the first insulating layer deposition that conforms to the side walls 194, 196 serves to insulate the biasing ferromagnetic layer 150 from the sensing ferromagnetic layer 132. Third, a final insulating layer deposition forms the top region of layer 160 and caps or seals the top surface of the biasing ferromagnetic layer 150.

The thickness of the first insulating layer deposition must be sufficient to electrically isolate the biasing ferromagnetic layer 150 from both the bottom lead 102 and side walls 194, 196. Such insulation can be achieved with minimum alumina thickness of 100 Å or a range of 100–500 Å. The thickness of the second insulating layer deposition must be sufficient to electrically isolate the biasing ferromagnetic layer 150 from the top lead 104. Such insulation can be achieved with alumina thickness in the range of 100–500Å.

The thicknesses of the first and second insulating layer depositions that form insulating layer 160 are limited by several factors. First, in order for the top lead structure 104 to conform over layer 160 and onto the MTJ 100 structure, the sum of the thickness of the first and second depositions must be close to the total thickness of the MTJ 100 structure, i.e., no more than 2× greater and ideally closer to 1×. Second, in order for the magnetostatic coupling field from the biasing ferromagnetic layer 150 to efficiently interact with the sensing ferromagnetic layer 132, the thickness of the first alumina deposition forming layer 160 must be sufficiently less than the thickness of the first and second gaps (G1 and G2). Otherwise, the magneto static fields will be attracted to the first and second shields (S1 and S2) of the ferrosensor. Since typical high-density sensors are fabricated with G1 and G2 in the 1000 Å range, the thickness of the first portion of the insulating layer should be in the 500 Å range, which results in an insulation coverage of side walls 194, 196 in the 250–400 Å range because of sputter efficiency. Clearly, ferromagnetic coupling efficiency is improved by minimizing this value but not at the expense of compromising electrical insulation. In summary, insulating layer 160, which is formed by two separate alumina depositions, serves to electrically isolate the biasing ferromagnetic layer 150 from the sensing ferromagnetic layer 132 of the MTJ 100 structure. The degree of ferromagnetic coupling between these two layers is determined by the thickness of the two depositions and is best when the thickness is minimized relative to the thickness of the first and second gaps, but not to the extreme of compromising the insulating integrity between the free layer and the ferromagnetic bias layer.

A representative set of materials for MTJ 100 (FIG. 4A) will now be described. All of the layers of the MTJ 100 are grown in the presence of a magnetic field applied parallel to the surface of the substrate. The magnetic field serves to orient the easy axis of all of the ferromagnetic layers. A 5 nm Ta seed layer (not shown) is first formed on a 10–50 nm Au layer that serves as the bottom electrical lead 102. The seed layer is comprised of a material which encourages the (111) growth of the face-centered cubic (fcc) $Ni_{81}Fe_{19}$ template layer 112. The template ferromagnetic layer 112 encourages the growth of the antiferromagnetic layer 116. Suitable seed layer materials include fcc metals, such as Cu, as well as Ta or a combination of layers, such as 3–5 nm Ta/3–5 nm Cu. The MTJ base electrode stack 110 comprises a stack of 4 nm $Ni_{81}Fe_{19}$/10 nm $Mn_{50}Fe_{50}$/8 nm $Ni_{81}Fe_{19}$ (layers 112, 116, 118, respectively) grown on the Ta seed layer on the 10–20 nm Au layer 102. The Au layer 102 is formed on the alumina gap material G1 that serves as the substrate. Next, the tunnel barrier layer 120 is formed by depositing and then plasma oxidizing a 0.8–2 m Al layer. This creates the $Al_2O_3$ insulating tunnel barrier layer 120. The top electrode stack 130 is a 5 nm Ni-Fe/10 nm Ta stack (layers 132, 134, respectively). The Ta layer 134 serves as a protective capping layer. The top electrode stack 130 is contacted by a 20 nm Au layer that serves as the top electrical lead 104.

Note that since the current passes perpendicular to the layers in MTJ 100, the resistance of the MTJ device will be largely dominated by that of the tunnel barrier layer 120. Thus, the resistance per unit area of the conducting leads 102, 104 can be much higher than in conventional MR read heads in which the current flows parallel to the layers. Thus, the leads 102, 104 can be made thinner and/or narrower than in conventional MR head structures, and/or can be made from intrinsically more resistive materials, such as alloys or combinations of elements.

It is important that the layers in the bottom electrode stack 110 be smooth, and that the $Al_2O_3$ tunnel barrier layer 120 be free of pinholes which would electrically short the junction. For example, growth by sputtering techniques known to produce good giant magnetoresistance effects in metallic multilayer stacks is sufficient. In the MTJ 100, the direction of the magnetic moments of the fixed and sensing ferromagnetic layers 118, 132, respectively, are approximately orthogonal to one another in zero applied magnetic field. The direction of the moment of the fixed layer 118 is largely determined by that of the exchange anisotropy field of the antiferromagnetic layer 116. The orientation of the moment of the sensing layer 132 is influenced by a member of factors, including the intrinsic anisotropy of the ferromagnetic layer itself and the shape of this layer. An intrinsic magnetic anisotropy can be induced in the sensing layer 132 by depositing it in a small magnetic field arranged to be perpendicular to that of the magnetization direction of the fixed layer 118. If the shape of the sensing layer 132 is not square, there may be a magnetic anisotropy resulting from the rectangular shape of the sensing layer. By choosing the length of the sensing layer (TW) to be longer than its height, the shape anisotropy will favor the magnetic moment of the sensing layer to be oriented perpendicular to that of the fixed layer 118. Thus, the intrinsic and shape anisotropies can be arranged to favor the proper orientation of the magnetic moment of the sensing layer perpendicular to that of the fixed layer. However, neither of these anisotropies is essential for the proper operation of the MTJ MR head. Proper orientation of the moment of sensing layer 132 can be accomplished by the presence of the biasing ferromagnetic layer 150 alone. The magnetostriction of the sensing layer 132 is arranged to be close to zero (by choice of composition of the Ni—Fe alloy) so that any stresses in this layer induced by the fabrication process do not, of themselves, lead to any magnetic anisotropy.

An alternative sensing ferromagnetic layer 132 may be comprised of a thin Co or $Co_{(100-x)}Fe_{(x)}$ or $Ni_{(100-x)}Fe_x$ (x is approximately 60) layer at the interface between the sensing ferromagnetic layer 132 and the tunnel barrier layer 120, with the bulk of layer 132 being a low magnetostriction material, such as $Ni_{(100-x)}Fe_x$ (x is approximately 19). The net magnetostriction of this type of sensing layer with a thin Co or $Co_{(100-x)}Fe_{(x)}$ or $Ni_{(100-x)}Fe_x$ (x is approximately 60) interface layer is arranged to have a value close to zero by slight variations of the composition of the bulk of layer 132.

An alternative fixed ferromagnetic layer 118 may be comprised largely of a bulk $Ni_{(100-x)}Fe_{(x)}$ layer with a thin layer of a Co or $Co_{(100-x)}Fe_{(x)}$ or $Ni_{(100-x)}Fe_x$ (x is approximately 60) layer at the interface with the tunnel barrier layer 120. The largest signal is obtained with Co or with the highest polarization $Ni_{(100-x)}Fe_x$ (x is approximately 60) or $Co_{(100-x)}Fe_{(x)}$ alloy (x is approximately 70). The interface layer is optimally about 1–2 nm thick. The net magnetostriction of the combined layer is arranged to be dose to zero by small variations of the composition. If the bulk of layer 118 is Ni—Fe, then the composition is $Ni_{81}Fe_{19}$, the composition for which bulk Ni—Fe has zero magnetostriction.

The Fe—Mn antiferromagnetic layer 116 may be replaced with a Ni—Mn layer or other suitable antiferromagnetic layer which exchange biases the ferromagnetic material in the fixed layer 118 and which has a resistance which is substantially less than that of the $Al_2O_3$ barrier layer. Similarly, the stability of the fixed ferromagnetic layer 118 can be increased further by forming it from a lamination of two magnetic layers, such as Ni, Co, Ni—Fe alloys, Co—Fe alloys, or Ni—Fe—Co ternary alloys, separated by a thin metallic layer, which results in antiferromagnetic coupling of the two magnetic layers. This type of laminated fixed layer is described in IBM's U.S. Pat. No. 5,465,185.

Process for Fabricating the MTJ MR Read Head

The process for preparing the MTJ MR read head according to the present invention will be described with reference to the process flow diagram of FIGS. 6A–6N. In this series of figures, the figures on the left represent cross-sectional views of the individual layers as they are deposited and patterned, and the figures on the right represent the corresponding top view to illustrate lithographic patterning to ultimately create the MTJ MR read head as shown, for example, in FIG. 4B.

Figure 6A:
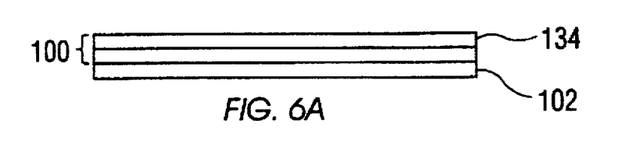
FIGS. 6A–6N illustrate steps in the fabrication of the MTJ MR read head of the present invention.
Figure 6B:
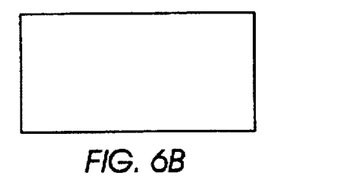
Figure 6C:
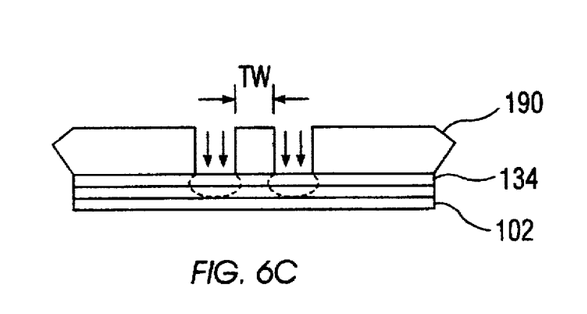
Figure 6D:
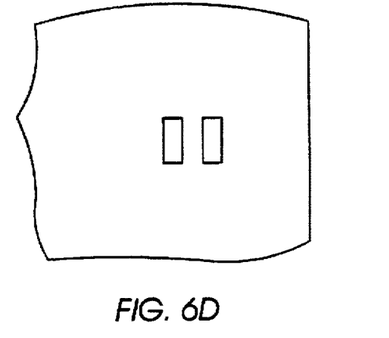
Figure 6E:
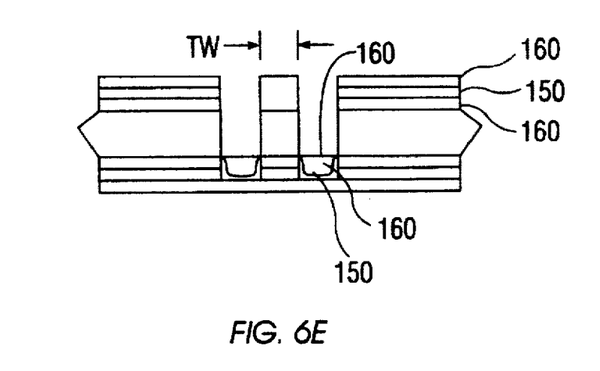
Figure 6F:
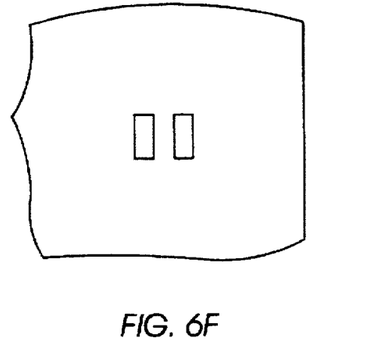
Figure 6G:
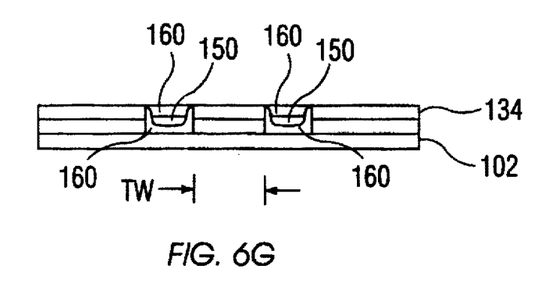
Figure 6H:
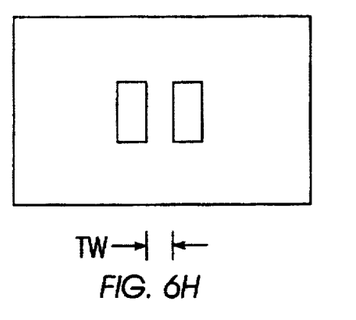
Figure 6I:
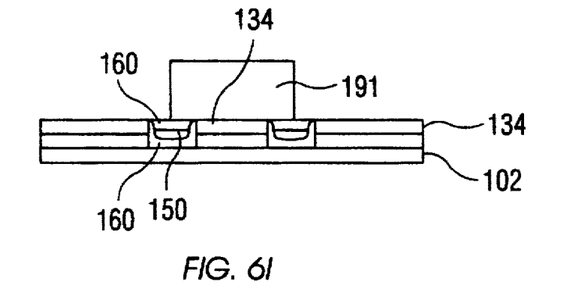
Figure 6J:
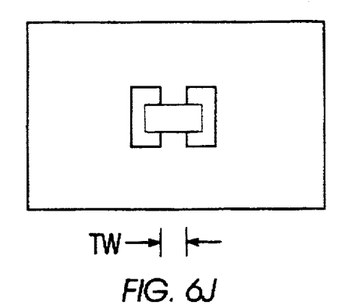
Figure 6K:
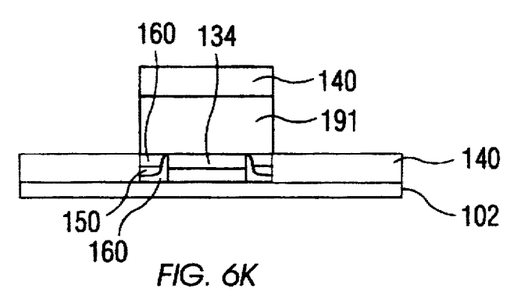
Figure 6L:
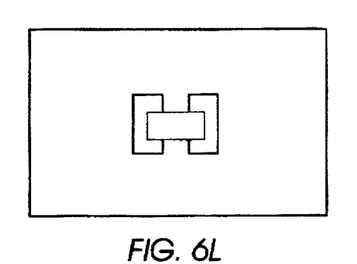
Figure 6M:
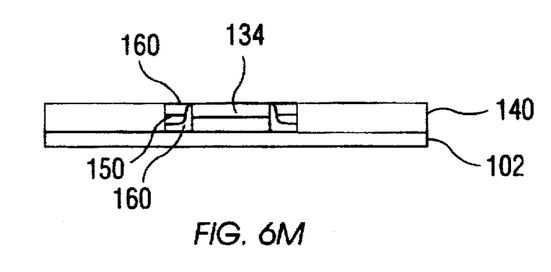
Figure 6N:
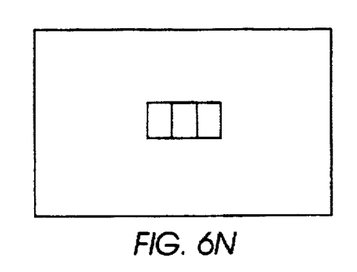

For ease in illustrating the process, the individual layers making up MTJ 100 will not be shown in FIGS. 6A–6N, but these series of layers will be individually referred to as the MTJ. The substrate (not shown) onto which the layers are deposited is the G1 alumina layer. Film growths are carried out by magnetron sputtering with argon (Ar) gas with the substrate at ambient temperature. Care must be taken to ensure that the sputter growth produces very smooth films. An applied magnetic field of magnitude 20–100 Oe, with the field direction in the plane of the substrate (and in the direction from left to fight in the figures) may be used to induce magnetic anisotropy into the magnetic layers as they are grown. As part of the formation of the MTJ 100, the aluminum layer which is to become the tunnel barrier layer 120 is deposited and then subsequently plasma oxidized at an oxygen pressure of 100 mTorr and a power density of 25 W/cm² for 30–240 seconds. This forms the insulating tunnel barrier layer 120 of alumina. The plasma oxidation of the aluminum layer is done without breaking vacuum in the process.

Although not essential to the operation of the MTJ device, it may be beneficial to induce in the fixed and sensing ferromagnetic layers appropriate magnetic anisotropies by depositing these layers in approximately orthogonal magnetic fields. Prior to the deposition of the sensing ferromagnetic layer 132 in the MTJ 100 and after formation of the alumina tunnel barrier layer 120, the substrate is rotated approximately 90 degrees in the plane of the substrate so as to be generally transverse to the applied magnetic field. Alternatively, the external applied magnetic field can be rotated.

While the MTJ device described and shown in FIG. 4A has the fixed ferromagnetic layer on the bottom of MTJ 100, the device can also be formed by depositing the sensing ferromagnetic layer first, followed by the tunnel barrier layer, the fixed ferromagnetic layer, and the antiferromagnetic layer. Such an MTJ device would then have the layers essentially inverted from the MTJ 100 shown in FIG. 4A.

The process starts in FIG. 6A with the sequential deposition of bottom lead 102 and MTJ 100 (which includes the top capping layer 134). These layers are then patterned into the shape of the bottom electrical lead 102, as shown by FIG. 6B. In the next step, FIG. 6C, lithography is used to define the track width TW of the MTJ 100. As shown in FIG. 6C, a positive photoresist 190 has been applied to the lead 102 and MTJ 100 and developed to define the track width. Subsequently, islands of material are removed from the MTJ 100 by ion milling down to the electrical lead layer 102. By suitable choice of material for capping layer 134, it may also be possible to reactively ion etch the capping layer 134 before ion milling the remaining MTJ layers.

Next, in FIGS. 6E–6F, the deposition of the initial alumina insulator layer 160, CoPtCr hard biasing ferromagnetic layer 150, and subsequent alumina insulator layer 160 are deposited through the openings in photoresist 190, leaving islands of electrically isolated longitudinal biasing material that forms the biasing ferromagnetic layer 150. The initial alumina layer 160 and subsequent alumina layer 160 are preferably formed by RF sputtering to provide full coverage over electrical lead 102 and at the edges of MTJ 100 and are each formed to a thickness of 100–500 Å. This process results in an insulator with high integrity since it is important that the sense current not be shunted through the hard biasing layer 150. The hard biasing layer 150, which is preferably a CoPtCr alloy, is preferably formed directionally by a directional deposition process, such as ion beam sputter deposition, so there is no edge overlap, and is deposited to a thickness of approximately twice the thickness of the sensing layer 132. The photoresist 190 and the alumina and hard biasing layers on top of it are then removed, resulting in the electrically isolated regions of hard biasing ferromagnetic layer 150 that are located at the side edges of the magnetic tunnel junction that define the track width TW (FIGS. 6G–6H). Next, lithography is used to form the initial stripe height (before lapping) of the MTJ 100 by deposition and patterning of photoresist 191 (FIGS. 6I–6J). Ion milling is then done down to the electrical conductor 102, followed by a deposition of the additional alumina 140, resulting in the structure shown in FIGS. 6K–6L. The photoresist 191 and alumina 140 on top of it are removed, leaving the structure shown in FIGS. 6M–6N. The fabrication of the MTJ MR head structure is then essentially complete, requiring only opening vias down to electrical conductor 102 and then overlaying the top electrical lead 104 onto the top of MTJ 100.

In order to obtain symmetric output characteristics for the MTJ device, the magnetization direction 133 of the ferromagnetic sensing layer 132 must be maintained in the direction shown in FIG. 4A, i.e., along the longitudinal direction with no transverse components. This is accomplished by balancing the ferromagnetic coupling field $H_{fc}$ between the sensing and fixed ferromagnetic layers with the demagnetization field $H_d$ from the fixed ferromagnetic layer. Note that in an MTJ device, since the tunneling current is flowing normal to the layers of the structure, little field is induced from current flow in the films. $H_{fc}$ depends critically on the nature of the interfaces between the ferromagnetic films and the actual junction and the thickness of the junction. $H_{fc}$ can vary from several Oersteds (Oe) to 20–50 Oe. $H_d$ depends on the geometry of the sensor, i.e., final stripe height SH and fixed ferromagnetic layer thickness t, and the fixed ferromagnetic magnetization M, and varies as [(t/SH)×M]. Thus, for t=50 Å, SH=10,000 Å, M=800 Oe, $H_d$ is in the 40 Oe range. By varying the geometry of the sensor and the characteristics of the interfaces, $H_d$ can be matched to $H_{fc}$. One manner of balancing these two forces is to design a sensor that minimizes both fields. $H_d$ can be minimized by using the laminated antiparallel fixed layer described in the previously-cited IBM U.S. Pat. No. 5,465,185. The net magnetic moment of such a layer is equivalent to the difference between the two pinned films, this difference being approximately 5 Å, so that $H_d$ is reduced to approximately 4 Oe. One can then optimize the interface to reduce $H_{fc}$.

After the lead 104 has been patterned and the MTJ MR head structure is essentially complete, it is still necessary to align the magnetization of the fixed ferromagnetic layer 118 in the proper direction. The Fe—Mn layer 116 for exchange coupling with the fixed ferromagnetic layer 118 is antiferromagnetic as deposited. However, its magnetization must be realigned so that it can exchange couple the fixed ferromagnetic layer 118 in the proper orientation. The structure is placed in an annealing oven and the temperature is raised to approximately 180° C., which is greater than the blocking temperature of Fe—Mn. At this temperature, the Fe—Mn layer no longer gives rise to an exchange anisotropy with the fixed ferromagnetic layer 118. An exchange anisotropy of the ferromagnetic layer 118 is developed by cooling the pair of layers 116, 118 in a magnetic field. The orientation of the magnetization of the fixed ferromagnetic layer 118 will be along the direction of the applied magnetic field. The applied magnetic field in the annealing oven thus causes the moment of the fixed ferromagnetic layer 118 to be fixed along the required direction perpendicular to the ABS, as shown by the arrow 184 in FIG. 5. This is a result of cooling the Fe—Mn layer in the presence of the ferromagnetic layer 118, magnetized by the applied magnetic field, in the required direction. Thus, at temperatures below the blocking temperature of Fe—Mn, in the presence of an applied magnetic field from the recorded medium, the magnetization of the fixed ferromagnetic layer 118 will not substantially rotate.

The final stripe height SH of the MTJ 100 in the device is formed by lapping the lithographically-formed front sensing edge to a final dimension back to line 161, thereby completing the structure shown in FIGS. 4A–4B.

The detailed description of the MTJ device has been presented above with respect to its use as a MR read head. However, the invention is fully applicable to an MTJ device for use as a memory cell in a solid state memory array. In such an application, the fixed ferromagnetic layer has its preferred magnetization direction fixed, in the absence of an applied magnetic field, so as to be either parallel or antiparallel to the magnetization direction of the sensing ferromagnetic layer, which is longitudinally biased by the electrically isolated ferromagnetic biasing layer. When the memory cell is "written to" by the applied magnetic field generated from a write current, the magnetization direction of the sensing ferromagnetic layer is rotated 180 degrees. The sense circuitry then determines whether the memory cell is a "one" or a "zero" by detecting the electrical resistance, which depends on whether the ferromagnetic layers are aligned parallel or antiparallel.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetic tunnel junction device for connection to sense circuitry for detecting changes in electrical resistance within the device, the device comprising:

a substrate;

a first electrically conductive lead formed on the substrate;

a magnetic tunnel junction stack formed on the first lead and comprising a fixed ferromagnetic layer having its magnetic moment fixed in a preferred direction in the absence of an applied magnetic field, an insulating tunnel barrier layer in contact with the fixed ferromagnetic layer, and a sensing ferromagnetic layer in contact with the insulating tunnel barrier layer, the sensing ferromagnetic layer having a generally rectangular shape and two opposite side edges;

a second electrically conductive lead formed on and in contact with the magnetic tunnel junction stack;

a biasing ferromagnetic layer formed on the substrate on opposite sides of said stack and spaced from the side edges of the sensing ferromagnetic layer, the biasing ferromagnetic layer having a magnetic moment for biasing the magnetic moment of the sensing ferromagnetic layer in substantially the same direction as the moment of the biasing ferromagnetic layer in the absence of an applied magnetic field;

an electrically insulating layer separating the biasing ferromagnetic layer and the sensing ferromagnetic layer from contact with one another at said side edges of the sensing ferromagnetic layer;

whereby when the electrical leads are connected to the sense circuitry the electrical resistance to current flow perpendicularly through the layers in said stack is determined by the relative magnetic moments of the fixed and sensing ferromagnetic layers, and sense current is prevented by said insulating layer from shunting to said biasing ferromagnetic layer.

2. The magnetic tunnel junction device according to claim 1 wherein the magnetic moments of the fixed and sensing ferromagnetic layers are oriented generally parallel or antiparallel to one another in the absence of an applied magnetic field.

3. The magnetic tunnel junction device according to claim 1 wherein the magnetic moments of the fixed and sensing ferromagnetic layers are oriented generally orthogonal to one another in the absence of an applied magnetic field.

4. The magnetic tunnel junction device according to claim 1 wherein the insulating layer also electrically insulates the biasing ferromagnetic layer from at least one of said leads.

5. The magnetic tunnel junction device according to claim 1 wherein the first electrical lead is the bottom lead, the magnetic tunnel junction stack is formed on the substrate such that the fixed ferromagnetic layer is in electrical connection with the first electrical lead, and the second electrical lead is the top lead and is in electrical contact with the sensing ferromagnetic layer.

6. The magnetic tunnel junction device according to claim 1 wherein the first electrical lead is the bottom lead, the magnetic tunnel junction stack is formed on the substrate such that the sensing ferromagnetic layer is in electrical connection with the first electrical lead, and the second electrical lead is the top lead and is in electrical contact with the fixed ferromagnetic layer.

7. The magnetic tunnel junction device according to claim 1 wherein all of the layers in said stack have generally the same rectangular shape with contiguous side edges.

8. The magnetic tunnel junction device according to claim 1 wherein the magnetic tunnel junction stack further comprises an antiferromagnetic layer in contact with the fixed ferromagnetic layer for fixing the magnetic moment of the fixed ferromagnetic layer in said preferred direction by interfacial exchange coupling.

9. A magnetic tunnel junction magnetoresistive read head for sensing data magnetically recorded on a medium, the head comprising:

a substrate;

a first electrode having a fixed ferromagnetic layer formed over the substrate, the magnetization direction of the fixed ferromagnetic layer being fixed along a preferred direction so as to be substantially prevented from rotation in the presence of an applied magnetic field from the medium;

a second electrode having a sensing ferromagnetic layer whose magnetization is oriented in a direction generally perpendicular to the magnetization direction of the fixed ferromagnetic layer in the absence of an applied magnetic field and is free to rotate in the presence of an applied magnetic field from the medium;

an insulating tunneling barrier layer located between the fixed and sensing ferromagnetic layers for permitting tunneling current in a direction generally perpendicular to the fixed and sensing ferromagnetic layers;

a biasing ferromagnetic layer for longitudinally biasing the magnetization direction of the sensing ferromagnetic layer in a direction generally perpendicular to the magnetization of the fixed ferromagnetic layer in the absence of an applied magnetic field;

an electrically insulating layer located between the biasing and sensing ferromagnetic layers for electrically isolating the biasing layer from the sensing layer; and a pair of electrical leads, each lead being connected to a respective electrode and electrically isolated from the biasing layer by the insulating layer, whereby when a sense current is passed between the electrodes it passes generally perpendicularly through the insulating tunneling barrier layer without passing into the biasing layer.

10. The head according to claim 9 further comprising an antiferromagnetic layer in contact with the fixed ferromagnetic layer for fixing the magnetization direction of the fixed ferromagnetic layer by interfacial exchange coupling.

11. The head according to claim 10 wherein a first one of the electrical leads is formed on the substrate and wherein the antiferromagnetic layer is formed on the substrate and located between the substrate and the fixed ferromagnetic layer, the fixed ferromagnetic layer being formed on and in contact with the antiferromagnetic layer, whereby the magnetization direction of the fixed ferromagnetic layer is fixed by interfacial exchange coupling with the antiferromagnetic layer.

12. The head according to claim 9 wherein a first one of the electrical leads is formed on the substrate and wherein the second electrode is formed on the first one of the leads and is located between the substrate and the insulating tunneling barrier layer.

13. The head according to claim 9 wherein the sensing ferromagnetic layer has a generally rectangular perimeter with a sensing edge oriented toward the medium, a back edge generally parallel to the sensing edge and spaced from the medium and two generally perpendicular side edges, and wherein the biasing ferromagnetic layer is located adjacent to said two side edges but separated from said two side edges by the insulating layer, whereby the magnetization direction of the sensing ferromagnetic layer is longitudinally biased in a direction generally parallel to said sensing edge.

14. The head according to claim 9 wherein the fixed ferromagnetic layer, the tunnel barrier layer, and the sensing ferromagnetic layer are formed as a stack of layers with the fixed ferromagnetic layer and the tunnel barrier layer having edges generally coplanar with the rectangular edges of the sensing ferromagnetic layer, and wherein the insulating layer electrically insulates said stack from the biasing ferromagnetic layer and said electrical leads.

* * * * *